(12) United States Patent
Jamann et al.

(10) Patent No.: US 8,281,266 B2
(45) Date of Patent: Oct. 2, 2012

(54) SYSTEMATIC, NORMALIZED METRIC FOR ANALYZING AND COMPARING OPTIMIZATION TECHNIQUES FOR INTEGRATED CIRCUITS EMPLOYING VOLTAGE SCALING AND INTEGRATED CIRCUITS DESIGNED THEREBY

(75) Inventors: Joseph J. Jamann, Nazareth, PA (US); James C. Parker, Zionsville, PA (US); Vishwas M. Rao, Breinigsville, PA (US)

(73) Assignee: Agere Systems LLC, Wilmington, DE (US)

( * ) Notice: Subject to any disclaimer, the term of this patent is extended or adjusted under 35 U.S.C. 154(b) by 613 days.

(21) Appl. No.: 12/365,010

(22) Filed: Feb. 3, 2009

(65) Prior Publication Data

US 2010/0037188 A1 Feb. 11, 2010

Related U.S. Application Data

(60) Provisional application No. 61/126,881, filed on May 7, 2008.

(51) Int. Cl.
*G06F 17/50* (2006.01)

(52) U.S. Cl. .......................... 716/108; 716/109
(58) Field of Classification Search ........... 716/132–136
See application file for complete search history.

(56) References Cited

U.S. PATENT DOCUMENTS

| | | | |
|---|---|---|---|
| 5,278,769 A | 1/1994 | Bair et al. | |
| 5,692,160 A | 11/1997 | Sarin | |
| 6,324,679 B1 * | 11/2001 | Raghunathan et al. | 716/133 |
| 7,010,475 B2 | 3/2006 | Ehrler | |
| 7,725,848 B2 * | 5/2010 | Nebel et al. | 716/136 |
| 8,024,694 B2 | 9/2011 | Jamann et al. | |
| 2004/0044510 A1 | 3/2004 | Zolotov et al. | |
| 2004/0230921 A1 * | 11/2004 | Hathaway et al. | 716/2 |
| 2007/0244676 A1 | 10/2007 | Shang et al. | |
| 2008/0195359 A1 | 8/2008 | Barker et al. | |

OTHER PUBLICATIONS

Hsu et. al. "Energy-Conscious compilation Based on voltage Scaling" ACM LCTES02-SCOPES, Jun. 19-21, 2001, pp. 1-10.*
Parker, et al.; "Methods for Designing Integrated Circuits Employing Voltage Scaling and Integrated Circuits Designed Thereby"; U.S. Appl. No. 12/364,918, filed Feb. 3, 2009.
Jamann, et al.; "A Systematic Benchmarking System and Method for Standardized Data Creation, Analysis and Comparison of Semiconductor Technology Node Characteristics"; U.S. Appl. No. 12/365,084, filed Feb. 3, 2009.
Snowdon, et al.; "Power Management and Dynamic Voltage Scaling: Myths and Facts"; National ICT Australia and School of Computer Science and Engineering, University of NSW, Sydney 2052, Australia, dated Sep. 16, 2005, 7 pages.
Kandemir, et al.; "Energy-Conscious Compilation Based on Voltage Scaling"; LCTES02-SCOPES02, Jun. 19-21, 2002, 10 pages.

(Continued)

*Primary Examiner* — Jack Chiang
*Assistant Examiner* — Binh Tat

(57) ABSTRACT

Various embodiments of methods of designing an integrated circuit (IC). One embodiment of one such method includes: (1) generating a functional design for the IC, (2) determining performance objectives for the IC, (3) determining an optimization target voltage for the IC, (4) determining whether the IC needs voltage scaling to achieve the performance objectives at the optimization target voltage and, if so, whether the IC is to employ static voltage scaling or adaptive voltage scaling, (5) using the optimization target voltage to synthesize a layout from the functional IC design that meets the performance objectives by employing a unitless performance/power quantifier as a metric to gauge a degree of optimization thereof and (6) performing a timing signoff of the layout at the optimization target voltage.

15 Claims, 8 Drawing Sheets

OTHER PUBLICATIONS

Masnica, et al.; "Establishing Benchmarks for Analyzing Benefits Associated With Voltage Scaling, Analyzing the Benefits and an Apparatus Therefor"; U.S. Appl. No. 12/510,082, filed Jul. 27, 2009.

Parker, et al.; "A Method for Designing Integrated Circuits Employing a Partitioned Hierarchical Design Flow and an Apparatus Employing the Method"; U.S. Appl. No. 12/510,104, filed Jul. 27, 2009.

Parker, et al.; "A Method for Designing Integrated Circuits Employing Context-Sensitive and Progressive Rules and an Apparatus Employing One of the Methods"; U.S. Appl. No. 12/510,122, filed Jul. 27, 2009.

Snowden, David; "Power Management and Dynamic Voltage Scaling: Myths and Facts", National ICT Australia and School of Computer Science and Engineering; Article, Sep. 16, 2005, pp. 1-7; University of NSW, Sydney 2052, Australia.

Spautra, H.; "Energy-Conscienous Comopilation Based on Voltage Scaling", Pennsylvania State University, LCTES02—SCOPES02; Jun. 19-21, 2002, 10 pages; University Park, PA.

* cited by examiner

SYSTEMATIC, NORMALIZED METRIC FOR ANALYZING AND COMPARING OPTIMIZATION TECHNIQUES FOR INTEGRATED CIRCUITS EMPLOYING VOLTAGE SCALING AND INTEGRATED CIRCUITS DESIGNED THEREBY

CROSS-REFERENCE TO RELATED APPLICATION

This application claims the benefit of U.S. Provisional Application Ser. No. 61/126,881, filed by Parker, et al., on May 7, 2008, entitled "A Novel Paradigm for Optimizing Performance, Power, Area and/or Yield in Integrated Circuits," commonly assigned with the invention and incorporated herein by reference. This application is also related to U.S. Non-Provisional application Ser. No. 12/364,918 filed by Parker, et al., on even date herewith, entitled "Methods for Designing Integrated Circuits Employing Voltage Scaling and Integrated Circuits Designed Thereby" and U.S. Non-Provisional application Ser. No. 12/365,084 filed by Jamann, et al., on even date herewith, entitled "A Systematic Benchmarking System and Method for Standardized Data Creation, Analysis and Comparison of Semiconductor Technology Node Characteristics," commonly assigned with the invention and incorporated herein by reference. U.S. Non-Provisional application Ser. No. 12/365,084 has now issued as U.S. Pat. No. 8,024,694.

TECHNICAL FIELD

This application is directed, in general, to a integrated circuits (ICs) and, more specifically, to a systematic, normalized metric for analyzing and comparing optimization techniques for ICs employing voltage scaling and ICs designed using the techniques.

BACKGROUND

Conserving resources, including energy, has become a preeminent objective in today's world. Manufacturers of ICs are sensitive to the need to improve the energy efficiency of their products. Those skilled in the pertinent art are aware that various measures may be taken in an electronic circuit to reduce its power consumption. One measure is to use cells (i.e., logic elements including devices, e.g., transistors) that leak less current when turned off. Another measure is to use a lower voltage to drive the cells. Unfortunately, using lower leakage current cells or lower drive voltages almost always reduces the speed at which signals propagate through the circuit. Consequently, the circuit may not operate as fast as needed or desired.

Area and yield are also important considerations in circuit design. IC fabrication cost generally decreases as IC substrate ("die") size decreases. Increasing yield means decreasing scrap, which by definition reduces overall IC fabrication cost.

Circuit designers use electronic design automation (EDA) tools, a category of computer aided design (CAD) tools, to create a functional circuit design, including a register transfer logic (RTL representation) representation of the functional circuit design, generate a "netlist" from the RTL representation, and synthesize a layout from the netlists. Synthesis of the layout involves simulating the operation of the circuit and determining where cells should be placed and where the interconnects that couple the cells together should be routed. EDA tools allow designers to construct a circuit, simulate its performance, determine its power consumption and area and predict its yield using a computer and without requiring the costly and lengthy process of fabrication. EDA tools are indispensable for designing modern ICs, particularly very-large-scale integrated circuits (VSLICs). For this reason, EDA tools are in wide use.

One such EDA tool performs timing signoff. Timing signoff is one of the last steps in the IC design process and ensures that signal propagation speed in a newly-designed circuit is such that the circuit will operate as intended. Signals that propagate too slowly through the circuit cause setup violations; signals that propagate too quickly through the circuit cause hold violations. Setup or hold violations corrupt the flow of logic through the logic of the circuit and give rise to functional errors.

Timing signoff is performed with highly accurate models of the circuit under multiple sets of assumptions regarding expected variations, called "PVT corners." Process-voltage-temperature (PVT) PVT corners are based on assumptions regarding variations in device operation, drive voltage and operating temperature. Resistance-capacitance (R, C, or RC) PVT corners are based on assumptions regarding variations in one or both of interconnect resistance and capacitance from one IC to another. Conventional timing signoff identifies setup and hold violations in a "slow" PVT corner (in which process variations are assumed to yield relatively slow-switching devices, and drive voltage and operating temperature are such that device switching speeds are their slowest) and a "worst" RC corner (in which process variations are assumed to yield interconnects having relatively high resistance and capacitance). Conventional timing signoff also identifies hold violations in a "fast" PVT corner (in which process variations are assumed to yield relatively fast-switching devices, and drive voltage and operating temperature are such that device switching speeds are their fastest) and a "best" RC corner (in which process variations are assumed to yield interconnects having relatively low resistance and capacitance). Conventional signoff timing also takes on-chip variations (OCV), which are process variations occurring over the area of a given IC, into account using statistical methods. The fast PVT and best RC corner are sometimes jointly referred to as a fast-fast (FF) or best-case fast (BCF) corner, and the slow PVT and worst RC corner are sometimes jointly referred to as a slow-slow (SS) or worst-case slow (WCS) corner.

Thus a fundamental tradeoff exists among speed and power consumption. Further considerations involve speed, power consumption, area and yield. These force the circuit designer to employ EDA tools, particularly timing signoff, to strike a delicate balance. Tempering the designer's zeal are the above-described process and environmental variations to which every production circuit is subject. These variations increase the degree to which the designer must ensure that production circuits work under real-world operating conditions and therefore the complexity of timing signoff.

Further complicating the designer's task is the difficulty of measuring and therefore being able to judge tradeoffs of speed and power consumption. Some metrics are effective for one process technology, but fail to translate to other technologies. Other metrics may apply to multiple technologies, but are difficult to understand and defy intuition. Thus, a designer is left with having to optimize based on experience and trust that he can communicate the wisdom of his decisions.

SUMMARY

One aspect provides a method of designing an IC. One embodiment of one such method includes: (1) generating a functional design for the IC, (2) determining performance objectives for the IC, (3) determining an optimization target voltage for the IC, (4) determining whether the IC needs voltage scaling to achieve the performance objectives at the optimization target voltage and, if so, whether the IC is to employ static voltage scaling or adaptive voltage scaling, (5) using the optimization target voltage to synthesize a layout from the functional IC design that meets the performance objectives by employing a unitless performance/power quantifier as a metric to gauge a degree of optimization thereof and (6) performing a timing signoff of the layout at the optimization target voltage.

One embodiment of another such method includes: (1) generating a functional design for the IC, (2) determining performance objectives for the IC, the performance objectives including one selected from the group consisting of: (2a) a target power consumption, (2b) a target area and (2c) a target speed, (3) determining an optimization target voltage for the IC, (4) determining whether the IC needs voltage scaling to achieve the performance objectives at the optimization target voltage and, if so, whether the IC is to employ static voltage scaling or adaptive voltage scaling, (5) using the optimization target voltage to synthesize a netlist from the functional IC design that meets the performance objectives by employing a unitless performance/power quantifier as a metric to gauge a degree of optimization thereof, (6) synthesizing a clock tree for the IC, (7) determining a routing at the optimization target voltage, (8) generating a layout of the IC from the netlist and (9) performing a timing signoff of the layout at the optimization target voltage.

One embodiment of yet another such method includes: (1) generating a functional IC design, (2) determining a target clock rate for the functional IC design, (3) generating a netlist from the functional IC design that meets the target clock rate, (4) determining a unitless performance/power quantifier from the netlist, (5) attempting to increase the unitless performance/power quantifier by changing at least one of a speed, an area and a power consumption in at least some noncritical paths in the netlist and (6) generating a layout of the IC from the netlist.

One embodiment of still another such method includes: (1) generating a functional IC design, (2) determining a target clock rate for the functional IC design, (3) determining a target area for the functional IC design, (4) determining a target power consumption for the functional IC design, (5) determining whether the IC is to employ voltage scaling or adaptive voltage scaling, (6) generating a netlist from the functional IC design that meets the target clock rate, (7) determining a unitless performance/power quantifier from the netlist, (8) attempting to increase the unitless performance/power quantifier by changing all of the speed, the area and the power consumption in the at least some noncritical paths in the netlist and (9) generating a layout of the IC from the netlist.

BRIEF DESCRIPTION

Reference is now made to the following descriptions taken in conjunction with the accompanying drawings, in which.

Figure 6:
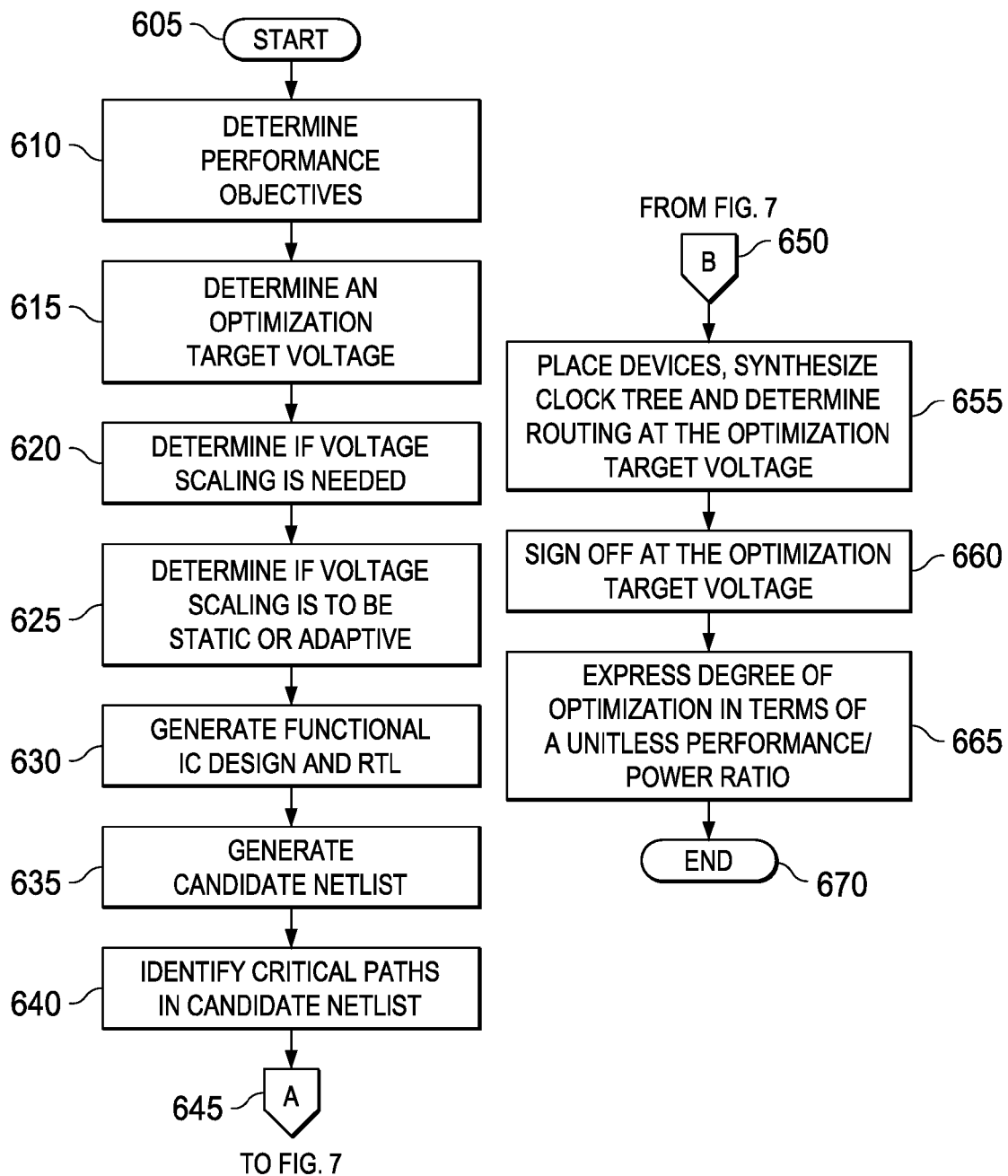
Figure 7:
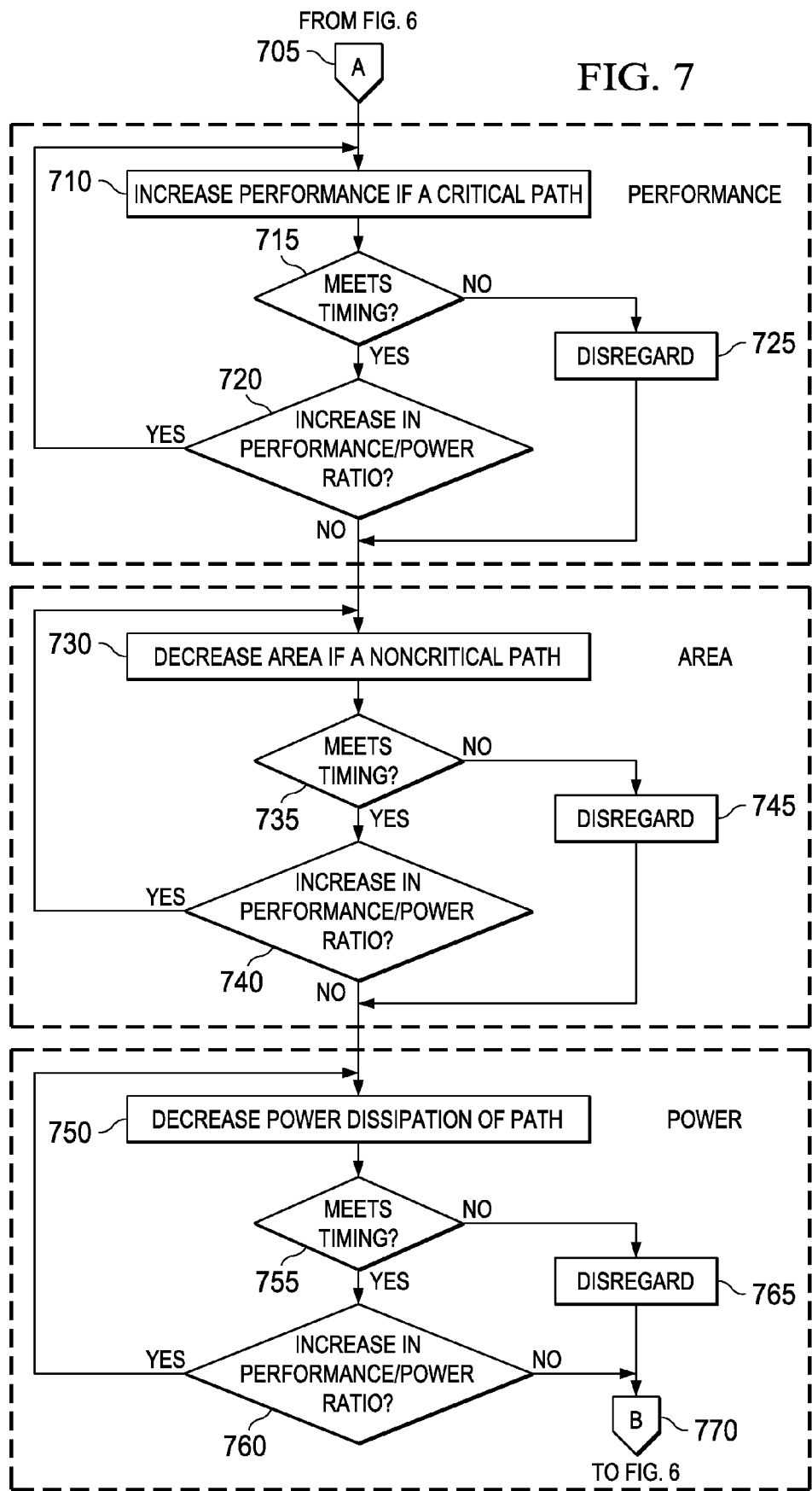
Figure 8:
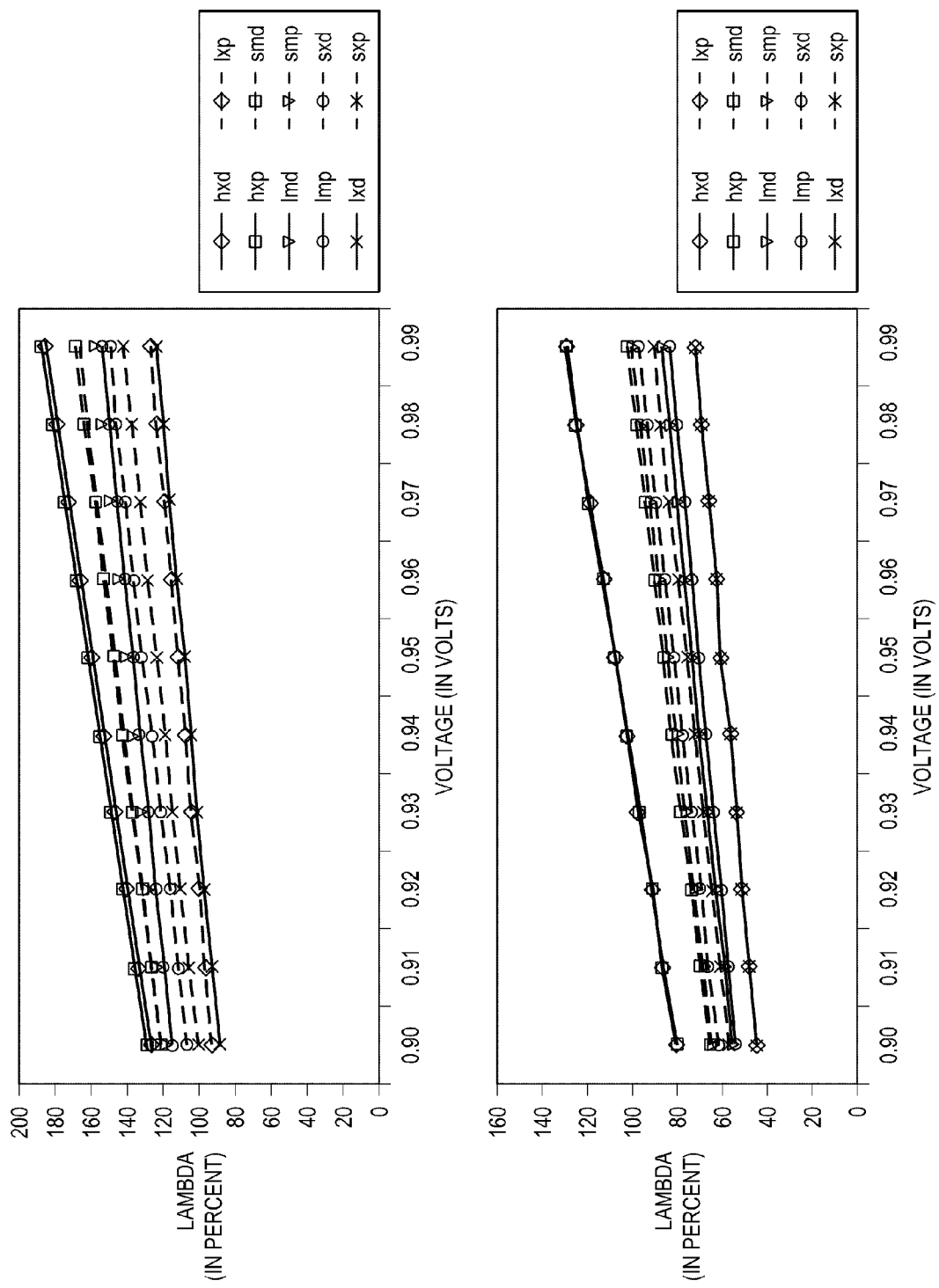
Figure 9:
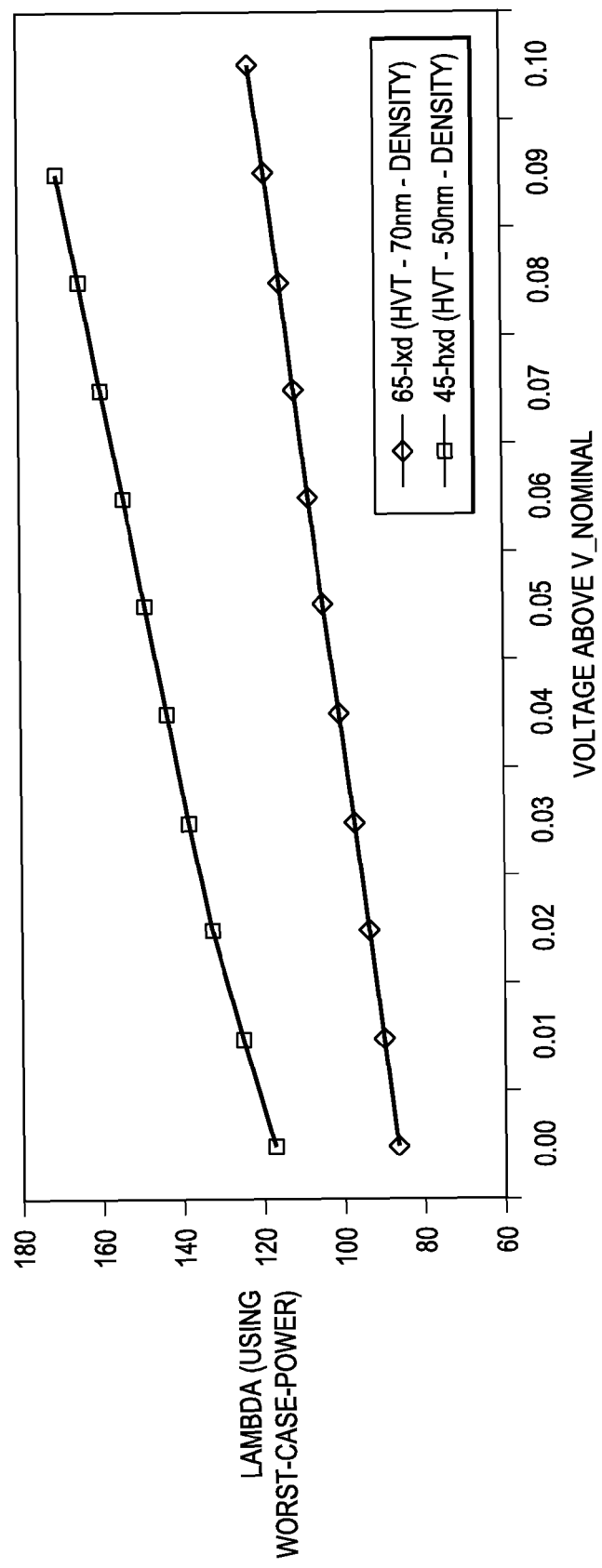

FIGS. 6 and 7 together are a flow diagram of another embodiment of a method of designing an IC employing voltage scaling that uses a unitless performance/power quantifier as a metric to gauge the degree of optimization;

FIG. 8 is a pair of graphs relating a unitless performance/power quantifier to drive voltage; and FIG. 9 is a graph relating unitless performance/power quantifiers for candidate fabrication technologies.

DETAILED DESCRIPTION

Voltage scaling, referred to in the Summary above, is a technique whereby the drive voltage to a particular IC is modulated to one or more particular values such that the IC can function properly. Voltage scaling is particularly suited to compensate for process variations. Static voltage scaling may be performed at the factory (e.g., during calibration) or before the IC begins normal operation (e.g., during powerup initialization). In contrast, adaptive voltage scaling (AVS) is performed continually while the IC is in normal operation and particularly effective at compensating for temperature variations and device aging as well as process variations. ICs can have one or more domains, each having its own voltage regulator. Drive voltage can therefore be modulated separately in each domain, allowing compensation for OCV to be carried out as well.

While voltage scaling (including AVS) is known, it has heretofore been used only to compensate for process and temperature variations and aging in an IC that has been designed by a conventional method. What has not been realized until now, however, is that voltage scaling has the potential to change the fundamental theory under which an IC operates, and that, accordingly, the method by which an IC is designed may be transformed to take full advantage of the benefits of voltage scaling. Consequently, introduced herein are novel methods of designing ICs such that their performance, area, power consumption, yield or any combination of these may be realized beyond the limits of current design methods.

These novel methods employ a systematic, normalized relationship between performance and power as a metric to gauge the degree to which a particular IC design has been optimized. As will be described below, the degree of optimization is achieved in a particular IC design is difficult to ascertain or express without the benefit of the metric. In various embodiments described herein, the metric is normalized across multiple IC fabrication scales, sometimes called "techniques" or "technologies."

Also introduced herein is an AVS architecture that is capable of adapting drive voltage independent of "system software," defined as external, user or application software (including firmware) that executes in the IC. System software is typically loaded into an IC following its delivery to a customer. In other words, system software does not need to take into account, or be involved in, the adaptation of drive voltage. Consequently, such software does not have to be modified to execute in an IC that employs the novel AVS architecture. Those skilled in the software art often call this trait "orthogonality" or "transparency;" the novel AVS architecture is orthogonal or transparent to the application software.

Figure 1:
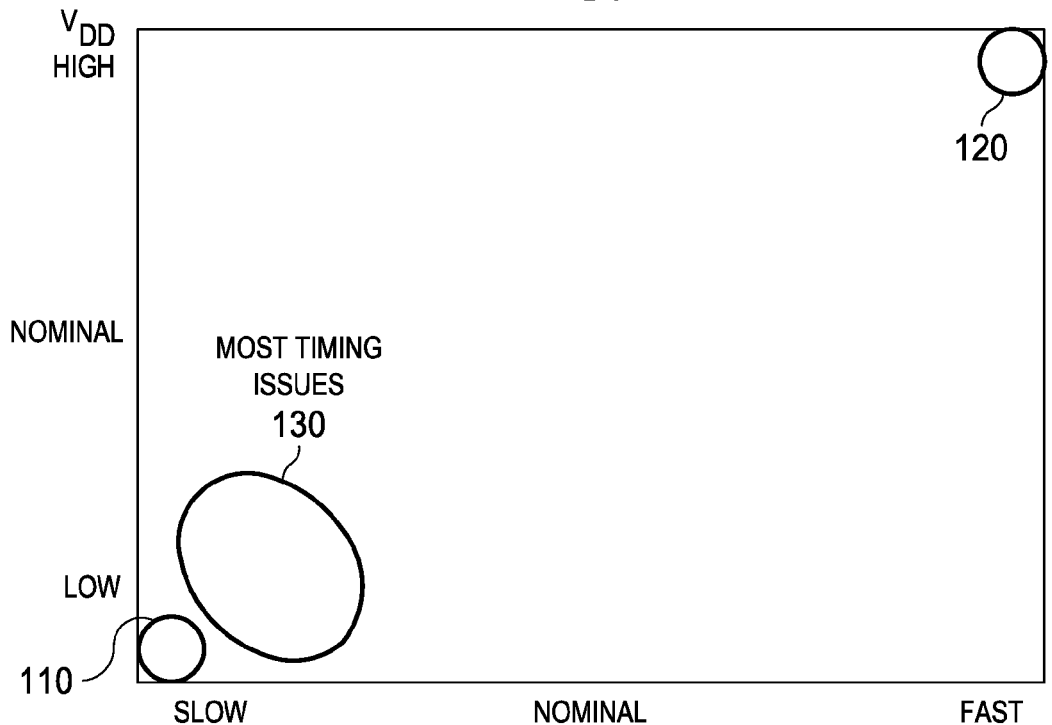
FIG. 1 is a graph of device drive voltage and device speed showing, in particular, traditional PVT corners with respect to an IC that does not employ voltage scaling.

FIG. 1 is a graph of device drive voltage and device speed showing, in particular, traditional PVT corners with respect to an IC not employing voltage scaling. FIG. 1 shows a "slow" PVT corner 110 in which process variations are assumed to yield relatively slow-switching devices, and drive voltage and operating temperature are such that device switching speeds are their slowest. FIG. 1 also shows a "fast" PVT corner 120 in which process variations are assumed to yield relatively fast-switching devices, and drive voltage and operating temperature are such that device switching speeds are their highest. The slow and fast PVT corners 110, 120 represent extremes. Setup violations result from signals propagating too slowly and arriving too late for subsequent use and are most likely to occur at the PVT slow PVT corner 110. Hold violations result from signals propagating too quickly and arriving too soon to be sustained for subsequent use and are most likely to occur at the fast PVT corner 120. Conventional timing analysis is performed at the slow and fast PVT corners 110, 120, since they represent the greatest challenge to IC operation. In fact, it has been found that most timing issues occur in a region 130 proximate and perhaps including the slow PVT corner 110.

It has also been determined that ICs operating with voltage scaling need not be subjected to timing analysis at the slow and fast PVT corners 110, 120. Voltage scaling renders the slow and fast PVT corners 110, 120 irrelevant. An IC employing voltage scaling (and particularly AVS) does not operate in these PVT corners. Instead, as will be shown, other PVT corners bound the operation of an IC employing voltage scaling. As stated above, it has been realized that the method by which an IC is designed may be modified to take advantage of this fact. Instead of selecting circuit configurations (e.g., architectures and datapath widths) and devices and closing timing at the slow and fast PVT corners 110, 120 (and conquering the region 130), the IC design process can instead focus on more fundamental design objectives: power, performance, area, yield or any combination of these.

Figure 2:
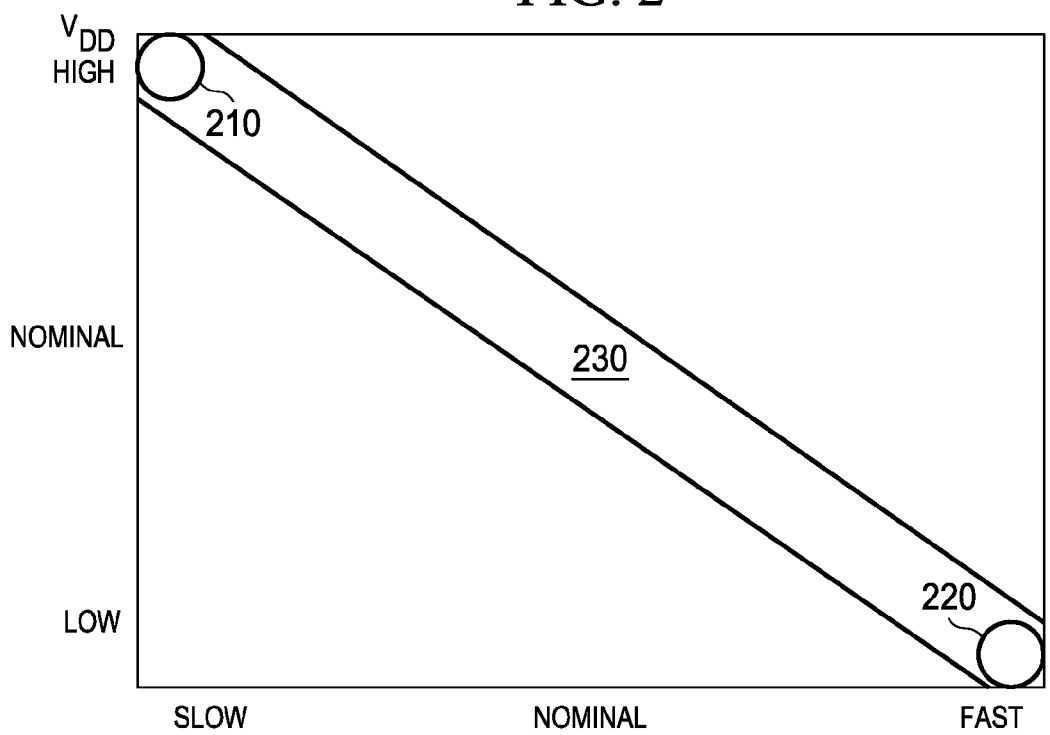
FIG. 2 is a graph of device drive voltage and device speed showing, in particular, PVT corners relevant to voltage scaling.

FIG. 2 is a graph of device drive voltage and device speed showing, in particular, PVT corners relevant to voltage scaling. FIG. 2 shows a first PVT corner 210 in which process variations are assumed to yield relatively slow-switching devices and temperatures are such that device switching speeds are at their slowest. However, under such conditions, voltage scaling compensates for this inadequate speed by setting drive voltage at its highest level, increasing speed to an acceptable level. FIG. 2 also shows a second PVT corner 220 in which process variations are assumed to yield relatively fast-switching devices and temperatures are such that device switching speeds are at their highest. However, under such conditions, voltage scaling compensates for this excessive speed by setting drive voltage at its lowest level, decreasing speed to an acceptable level. Given OCV and temperature variations over the area of an IC, a region 230 results. It has been determined that IC design efforts are best spent on optimizing performance in the region 230. In one embodiment, IC design efforts are focused exclusively in the region 230.

The method introduced herein can also be applied in a reduced risk manner by creating extended safe-zones of operation. In addition, AVS can be employed to introduce over-drive (e.g., to about 110% $V_{DD}$) and under-drive (e.g., to about 90% $V_{DD}$). Of course, other ranges of over- and under-drive may be employed in alternative embodiments. Furthermore, over- and under-drive need not be the same. AVS gives the IC designer the ability to choose a desired optimization target in a safe-zone as will now be shown.

Figure 3:
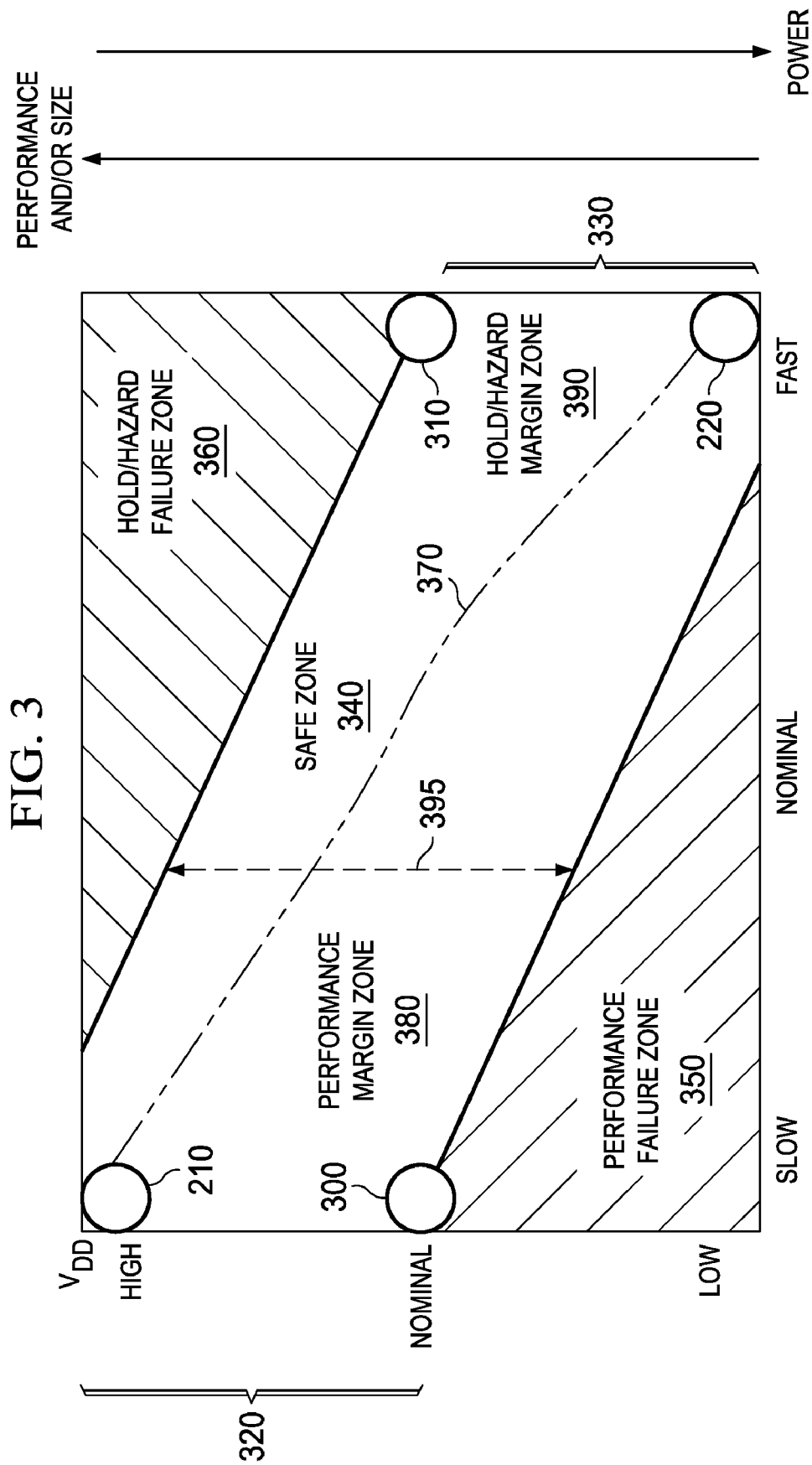
FIG. 3 is a graph of device drive voltage and device speed showing, in particular, performance failure, hold/hazard failure and safe operating zones for an IC employing voltage scaling.

FIG. 3 is a graph of device drive voltage and device speed showing, in particular, performance failure, hold/hazard failure and safe operating zones for an IC employing voltage scaling. FIG. 3 shows the first and second PVT corners 210, 220 of FIG. 2. FIG. 3 also shows third and fourth PVT corners 300, 310. The third PVT corner 300 represents a nominal drive voltage $V_{DD}$ applied to an IC in which process variations are assumed to yield relatively slow-switching devices and temperatures are such that device switching speeds are at their slowest. The fourth PVT corner 310 represents a nominal drive voltage $V_{DD}$ applied to an IC in which process variations are assumed to yield relatively fast-switching devices and temperatures are such that device switching speeds are at their highest. A span 320 represents a range of over-drive, and a span 330 represents a range of under-drive. Thus, the first, second, third and fourth PVT corners 210, 220, 300, 310 define a safe zone 340 of operation for an IC within which AVS is capable of scaling drive voltage to maintain proper IC operation.

A performance failure zone 350 lies below the safe zone 340 and encompasses operating conditions in which setup failures would occur. A hold/hazard failure zone 360 lies above the safe zone 340 and encompasses operating conditions in which hold failures would occur. An operating line 370 representing the points of actual operation of a particular IC lies within the safe zone 340 and is, as expected, bounded on its ends by the first and second PVT corners 210, 220. The operating line 370 divides the safe zone 340 into a lower, performance margin zone 380 and an upper, hold/hazard margin zone 390. The lower, performance margin zone 380 represents a margin by which the operating line 370 is separated from the performance failure zone 350. This margin comes at the cost of performance: performance is lower, and power and area are higher, than optimal. The upper, hold/hazard margin zone 390 represents a margin by which the operating line 370 is separated from the hold/hazard failure zone 360. This margin comes at the cost of additional buffering needed to hold signals pending subsequent use.

The graph of FIG. 3 reveals several aspects of optimization that may be exploited. First, as an upwardly pointing arrow to the right of the graph of FIG. 3 indicates, the performance of the IC may be increased, or the area of the IC may be decreased, by reducing the performance margin zone 380. Second, as a downwardly pointing arrow to the right of the graph of FIG. 3 indicates, the power consumed by the IC may be decreased by reducing the hold/hazard margin zone 390. Consequently, optimizing the design of an IC in terms of performance, power and area amounts to minimizing the width (indicated by a line 395) of the safe zone 340. As a result, power consumption may be reduced (fast devices can operate at a lower drive voltage), smaller cells (of less area) may be used, further reducing power consumption to meet the same performance (slow devices can operate at a higher drive voltage), and the performance of the IC can be increased by avoiding the slow PVT corner 110 of FIG. 1, allowing the IC to be run faster than previously (slow devices can operate at a higher drive voltage). Furthermore, IC design and test time ("turn-around-time") can be decreased due to reduced CAD tool run-times and ease in achieving existing performance requirements. Process variations may also be reduced, and yields increased, in IC designs implemented at non-worst-case PVT corners.

One metric that may be employed to evaluate the degree to which a particular IC design has been optimized is a unitless performance/power quantifier, which may be coined as "lambda," or $\lambda_f$. An early benchmark indicates that one embodiment of the method described herein applied to an IC designed with 40 nm technology can realize about a 130% increase in the unitless performance/power quantifier over a conventional design method. Another embodiment of the method was applied to a test-case to understand the benefits realized in the 65 nm-LP and 65 nm-G+ technologies.

TABLE 1

Benefits Realized in 65 nm-LP and 65 nm-G+ Technologies

| Technology | Performance Gain Beyond Traditional Worst-Case | Power Reduction Beyond Traditional Worst-Case | Area Reduction Beyond Traditional Worst-Case |
| --- | --- | --- | --- |
| 65 nm-LP | Not optimized | +17% | +18% |
| 65 nm-LP | +50% | −30% | −13% |
| 65 nm-G+ | Not optimized | +42% | +16% |
| 65 nm-G+ | +27% | −5% | −6% |

Table 1, above, indicates a completely new optimization space beyond that offered by conventional IC design methods. Table 1 also indicates the potential effectiveness of using the unitless performance/power quantifier to evaluate optimization.

As stated above, one aspect of the invention is directed to an architecture that allows AVS to be carried out in such a way that it is transparent or orthogonal to system or application software. One embodiment of the architecture is implemented as a fully integrated, self-governing, closed-loop system. Another embodiment of the architecture is implemented in minimalist form as an open-loop solution. Several variations are possible between these two extreme implementations by selecting components of the architecture. In conjunction, the degree of system software control can be tuned from zero-intervention to full-control, and variations in between. While the flexibility enables a range of solutions, these solutions should be managed with reference to the components of the architecture employed in a particular IC design.

Figure 4:
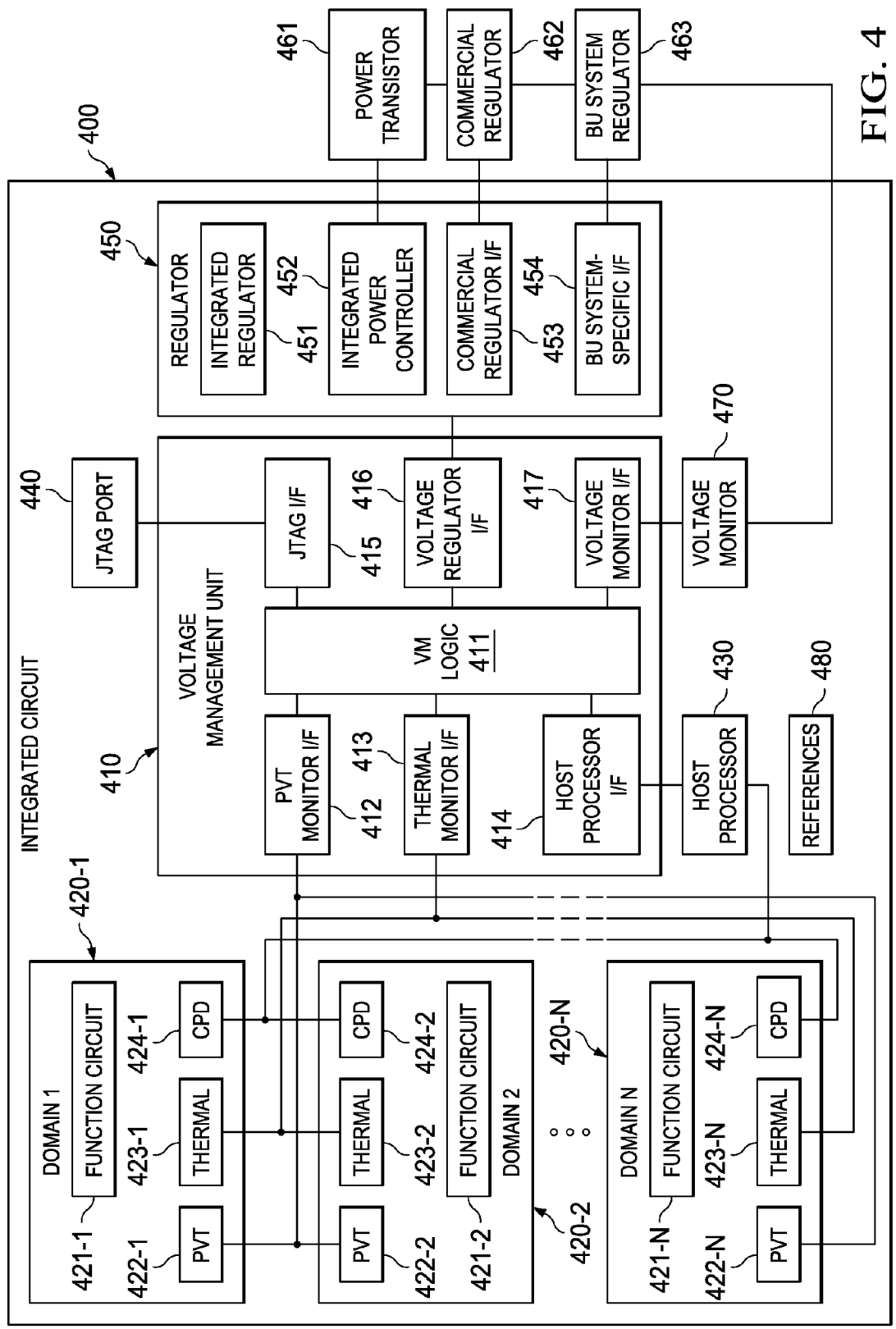
FIG. 4 is a block diagram of various embodiments of an IC employing an adaptive voltage scaling (AVS) architecture.

FIG. 4 is a block diagram of various embodiments of an IC 400 employing an AVS architecture. As described above, an AVS architecture is introduced that is transparent or orthogonal to external software. Such software can gain access to certain embodiments of the architecture, allowing the software to receive AVS data or control AVS. The IC 400 has N domains, N being any integer number.

The IC 400 has a voltage management unit (VMU) 410. The VMU 410 is configured to set one or more drive voltages $V_{DD}$ within a range $V_{min}$ to $V_{max}$ based on signals received from one or more monitors in each of the N domains. The VMU 410 typically sets the drive voltage $V_{DD}$ in each domain at the lowest level necessary (subject to a small safety margin) to guarantee that signal propagation speeds are adequate to avoid setup errors. This allows the IC 400 to operate at a reduced (e.g., minimal) power consumption level. The VMU 410 includes voltage management (VM) logic 411 configured to execute algorithms for interpreting signals from the monitors and scaling voltage in response thereto. A PVT monitor interface 412 is configured to provide an interface for one or more PVT monitors (to be described below). A thermal monitor interface 413 is configured to provide an interface for one or more thermal monitors (to be described below). A host processor interface 414 is configured to provide an interface for a host processor (to be described below). A Joint Test Experts Group (JTAG) interface 415 is configured to provide an interface for a JTAG port (to be described below). A voltage regulator interface 416 is configured to provide an interface for one or more voltage regulators (to be described below). A voltage monitor interface 417 is configured to provide an interface for a voltage monitor (to be described below).

As stated above, the IC 400 has N drive voltage domains. FIG. 4 explicitly illustrates three domains: a domain 1 420-1, a domain 2 420-2 and a domain N 420-N. Each domain has functional circuitry associated with it, namely functional circuits 421-1, 421-2, . . . , 421-N. The functional circuits 421-1, 421-2, . . . , 421-N carry out the useful functions that the IC 400 has been designed to perform. For example, if the IC 400 is a microprocessor, the functional circuits 421-1, 421-2, . . . , 421-N may include an address decoder, an arithmetic and logic unit, a floating point unit, a register file and read-only memory for storing microcode. If the IC 400 is a mixed-signal application-specific IC (ASIC), the functional circuits 421-1, 421-2, . . . , 421-N may include analog-to-digital converters (ADCs), digital-to-analog converters (DACs), and various circuits for manipulating analog and digital signals. The functional circuits 421-1, 421-2, . . . , 421-N of the various domains 420-1, 420-2, . . . , 420-N may differ in size, function, configuration or in any other respect.

Each domain also has various monitors associated therewith. PVT monitors 422-1, 422-2, . . . , 422-N may respectively associated with the domains 420-1, 420-2, . . . , 420-N and coupled to the PVT monitor interface 412. The PVT monitors 422-1, 422-2, . . . , 422-N are configured to produce signals that are based on their respective device speeds and may take the form of ring oscillators.

Thermal monitors 423-1, 423-2, . . . , 423-N may also respectively associated with the domains 420-1, 420-2, . . . , 420-N and coupled to the thermal monitor interface 413. The thermal monitors 423-1, 423-2, . . . , 423-N are configured to produce signals that are based on their respective temperatures.

Critical path detectors (CPDs) 424-1, 424-2, . . . , 424-N (sometimes called critical path monitors, or CPMs) may also respectively associated with the domains 420-1, 420-2, . . . , 420-N and are coupled to a host processor 430. The host processor 430 is in turn coupled to the host processor interface 414 of the VMU 410. The CPDs 424-1, 424-2, . . . , 424-N are configured to produce signals that are based on the actual arrival times of signals in critical paths relative to when they are supposed to arrive. In one specific embodiment, the CPDs 424-1, 424-2, . . . , 424-N provide a binary response if a fixed margin from the critical path is transgressed. The outputs of the CPDs 424-1, 424-2, . . . , 424-N are OR-ed and brought as a single signal to the VMU 410 so that the VMU 410 can take evasive action in the event a margin transgression occurs. Various embodiments of CPDs are set forth in U.S. patent application Ser. No. 12/247,992, filed by Chakravarty on Oct. 8, 2008, entitled "Critical Path Monitor for an Integrated Circuit and Method of Operation Thereof," commonly assigned herewith and incorporated herein by reference.

In the embodiment of FIG. 4, the CPDs 424-1, 424-2, . . . , 424-N provide a binary response if a fixed margin from the critical path is transgressed. The outputs of the CPDs are OR-ed and brought as a single signal to the VMU so that the VMU can take evasive action in the event that there is a margin transgression. Note that this is an optional feature and the CPD input of the VMU can be hardwired to suppress this feature if it is not required in a specific implementation.

As the functional circuits 421-1, 421-2, . . . , 421-N operate, the PVT monitors 422-1, 422-2, . . . , 422-N, thermal monitors 423-1, 423-2, . . . , 423-N and the CPDs 424-1, 424-2, . . . , 424-N generate signals indicating device speeds, temperatures and critical path speeds in their respective domains 420-1, 420-2, . . . , 420-N. As stated above, the VM logic 411 receives these signals and makes decisions regarding the scaling of drive voltages to be supplied to the domains 420-1, 420-2, . . . , 420-N.

A JTAG port 440 is coupled to the JTAG interface 415. The JTAG port 440 allows the VMU 410 to be tested. Those skilled in the pertinent art are familiar with the use of JTAG or other boundary scan testing techniques that may be employed to test circuitry.

A voltage regulator unit 450 is coupled to the voltage regulator interface 416 of the VMU 410. The voltage regulator unit 410 is configured to receive voltage control signals from the VMU 410 and scale drive voltages supplied to the domains 420-1, 420-2, . . . , 420-N. FIG. 4 shows four different alternative embodiments of the voltage regulator unit 450. In a first embodiment, the voltage regulator unit 450 includes a fully integrated (on-chip) regulator 451 configured to receive one or more voltage regulator signals and generate one or more corresponding drive voltages. In a second embodiment, the voltage regulator unit 450 includes an integrated (on-chip) power controller 452 configured to receive one or more voltage regulator signals and drive one or more external (off-chip) power transistors 461 to generate one or more corresponding drive voltages. In a third embodiment, the voltage regulator unit 450 includes a generic commercial regulator interface 453 configured to receive one or more voltage regulator signals and provide them to one or more external (off-chip) commercial regulators 462 to generate one or more corresponding drive voltages. In a fourth embodiment, the voltage regulator unit 450 includes a system-specific regulator interface 454 configured to receive one or more voltage regulator signals and drive one or more specific off-chip system regulators 463 to generate one or more corresponding drive voltages.

Irrespective of the embodiment, a voltage monitor 470 monitors the one or more drive voltages and provides a feedback signal through the voltage monitor interface 417 of the VMU 410. References 480 provide voltage or current references as needed to form a basis for comparison for, among other things, the PVT monitors 422-1, 422-2, . . . , 422-N, thermal monitors 423-1, 423-2, . . . , 423-N and the CPDs 424-1, 424-2, . . . , 424-N and the voltage monitor 470.

While the illustrated embodiment of the AVS architecture is capable of operating transparently or orthogonally with respect to system software executing in the IC 400, it also allows some software intervention. For example, software may monitor and gather data from internal registers of the VMU 410. System software may be allowed override the VMU 410 and take direct control over voltage scaling. This may be employed, for example, to implement frequency-dependent voltage scaling. System software may also be able to initiate or perform diagnostics with respect to the AVS architecture.

Having described various embodiments of an AVS architecture within the context of an IC, various embodiments of a systematic, normalized metric for analyzing and comparing optimization techniques will now be described. The metric can provide the ability to analyze, compare and concisely communicate optimization degree and resulting benefits across different technologies, yielding a major advantage in both understanding and customer communication. Particularly described below is a normalized unitless performance/power quantifier-based optimization metric that can be applied in an IC employing voltage scaling, including AVS. The metric allows technologies and methods for optimizing circuits to be compared.

IC design optimization has, to date, been performed ad-hoc using raw metrics of performance, power and area data. These raw metrics, while capable of indicating that a design has been improved improvement, fail to account for changes occurring over multiple dimensions and do not provide a consistent framework for analyzing across technologies. Thus, they are incapable of forming a basis for comparison and contrast. Consequently, they hamper communication of optimization results among engineers and customers. Various embodiments herein address these shortcomings by providing a relative unitless performance/power quantifier. One embodiment of such a unitless performance/power quantifier may be determined as follows.

First, a reference traditional worst-case unitless performance/power quantifier (expressed as $PP_{WORSTCASE}$) may be defined as follows:

$$PP_{WORSTCASE} = \frac{Performance_{MAX}(SS, V_{DD} = V_{MIN}, T_{Worst\_Perf})}{Power(FF, V_{DD} = (V_{NOM}\_OR\_V_{MAX}, T_{Worst\_Power}))} \frac{MHz}{\mu Watts}$$

In this equation, $Performance_{MAX}(SS, V_{DD}=V_{MIN}, T_{Worst\_Perf})$ specifies the maximum operating frequency achieved by the design at the WCS PVT corner when a particular IC design is fully optimized for that PVT corner. The IC can be designed either at the transistor-level, at the gate level, or synthesized from RTL. $Performance_{MAX}(SS, V_{DD}=V_{MIN}, T_{Worst\_Perf})$ specifies a worst-case-performance PVT corner as resulting from an SS PVT corner process, with a $V_{MIN}$ drive voltage and operating at a junction temperature of $T_{Worst\_Perf}$ which can either be $-40°$ C. or $+125°$ C., depending on the technology. In this equation, $Power(FF, V_{DD}=(V_{NOM}\_OR\_V_{MAX}, T_{Worst\_Power}))$ specifies the maximum power consumed by the circuit (which is the same one synthesized and used to achieve $Performance_{MAX}(SS, V_{DD}=V_{MIN}, T_{Worst\_Perf})$). In one embodiment, the same convention used to compute the worst-case power determines the value of $V_{DD}$ used. Therefore, the flexibility in the equation to use $V_{NOM}$ or $V_{MAX}$ remains, as long as it used consistently for subsequent computations. Power computations are typically carried out using the models based on the FF PVT corner due to the high leakage that occurs in the FF PVT corner.

As described above, voltage scaling, including AVS, involves avoiding the WCS PVT corner for the design by increasing the voltage (between the range of $V_{NOM}$ and $V_{MAX}$) at the SS PVT corner and reducing it (in the range of $V_{NOM}$ and $V_{MIN}$) in the FF PVT corner. In the illustrated embodiment, the actual voltage determination is made based on voltage regulator tolerance, margin, and whether voltage scaling or AVS is employed. In the illustrated embodiment, that the slow PVT corner drive voltage is stepped between $V_{NOM}$ and $V_{MAX}$ (with each step being $V_I$), and the fast PVT corner voltage used for power computations is $V_{AVS\_Power}$, which is advantageously determined in advance due to package thermal computation constraints.

IC architectures and datapath widths may change for each step of the drive voltage $V_I$ when an IC is synthesized from RTL. This is because synthesis may include the selection of architectures in response to performance changes induced by the voltage shift.

A unitless performance/power quantifier $PP_I$ may thus be defined as:

$$PP_I = \frac{Performance_{MAX}(SS, V_{DD} = V_I, T_{Worst\_Perf})}{Power(FF, V_{DD} = (V_{AVS\_Power}, T_{Worst\_Power}))} \frac{MHz}{\mu Watts}$$

In this equation, $Performance_{MAX}(SS,V_{DD}=V_I,T_{Worst\_Perf})$ specifies the maximum operating frequency achieved by the design for in the SS PVT corner at the voltage $V_{DD}=V_I$ operating at a temperature of $T_{Worst\_Perf}$, which produces the worst delay for circuit components. $Power(FF,V_{DD}=(V_{AVS\_Power},T_{Worst\_Power}))$ specifies the maximum power consumed by the circuit, (which is the one synthesized/used for achieving $Performance_{MAX}(SS,V_{DD}=V_I,T_{Worst\_Perf})$. In the illustrated embodiment, the value of $V_{DD}$ used is $V_{AVS\_Power}$.

It can be seen that the unitless performance/power quantifier $PP_I$ is has units. A unitless value would allow comparisons to be made across technologies. A unitless performance/power quantifier $\lambda_I$ may therefore be determined for each voltage step as follows:

$$\lambda_I = \left(\frac{PP_I - PP_{WORSTCASE}}{PP_{WORSTCASE}}\right) \times 100\%$$

The unitless performance/power quantifier $\lambda_I$ indicates the percentage improvement in performance/power quantifier provided by an optimization step or from one technology to another. $\lambda_I$ may be regarded as a return-on-optimization investment for a given technology or capability. Plotting unitless performance/power quantifier $\lambda_I$ for different techniques or technologies provides an unbiased framework for comparing them.

The unitless performance/power quantifier $\lambda_I$ may be employed in a variety of ways, some of which are as follows:
1. Comparing the relative benefits of voltage scaling among different technologies or capabilities.
2. Determining which voltage scaling regulation scheme to use (i.e., whether or not AVS should be used) for a given design and target technology.
3. Carrying out library analyses to determine which library (out of a given set of offerings) provides the highest optimization.
4. Determining how different device threshold voltage and channel length variants compare within a given library set, and guiding the recommendation of the mix for a given IC design.

Further, while the performance/power quantifier is described in conjunction with AVS and optimization thereof, those skilled in the pertinent art should understand that the performance/power quantifier can benefit other voltage scaling techniques, such as dynamic voltage and frequency scaling (DVFS) and adaptive body-bias (ABB). In the latter case, the performance/power quantifier may be computed for different values of bias voltage, shedding light on how various bias techniques can be exploited. Moreover, independent of AVS, DVFS, ABB and optimization techniques related thereto, the performance/power quantifier can also assist technology evaluation and enhance the understanding of what a technology can offer.

Figure 5:
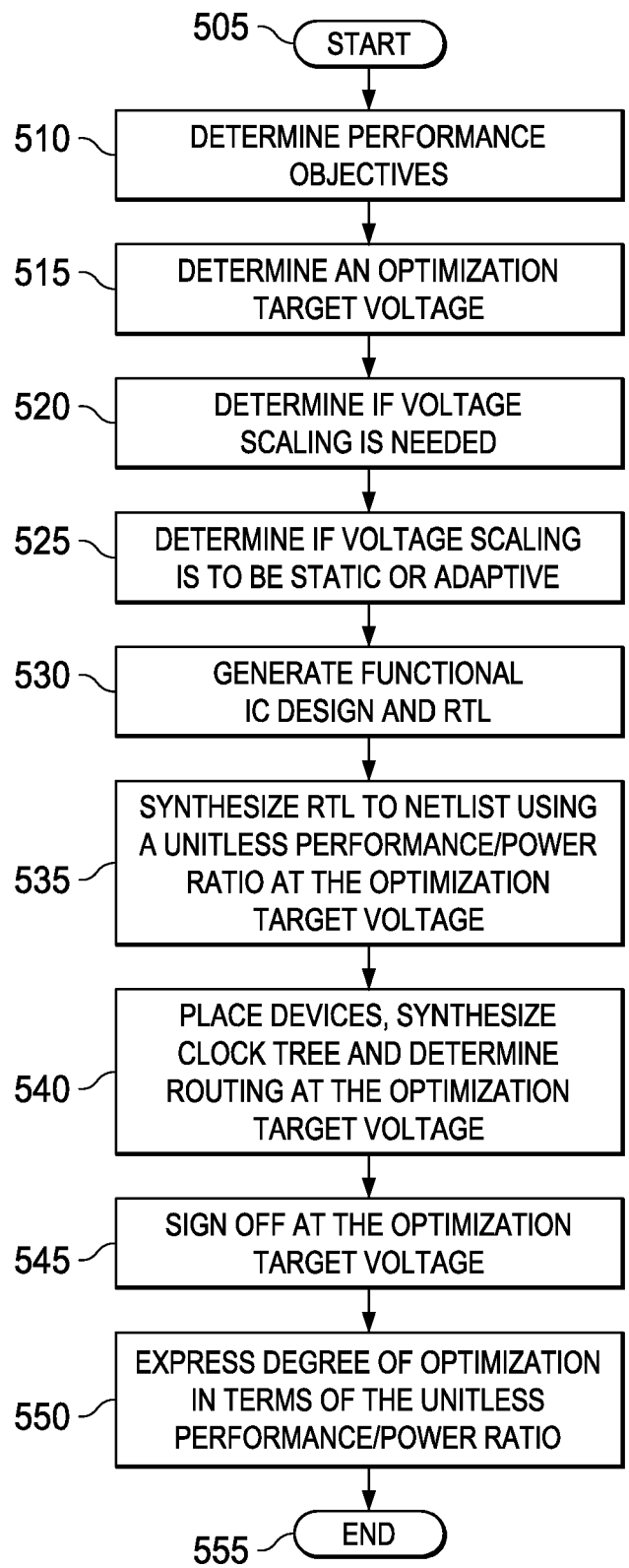
FIG. 5 is a flow diagram of one embodiment of a method of designing an IC employing voltage scaling that uses a unitless performance/power quantifier as a metric to gauge the degree of optimization.

FIG. 5 is a flow diagram of one embodiment of a method of designing an IC employing voltage scaling that uses a unitless performance/power quantifier as a metric to gauge the degree of optimization. The method begins in a start step 505. In a step 510, performance objectives are determined. The performance objectives may be expressed in terms of a target data throughput, a target clock frequency, a target die size, a target overall power consumption, a target yield percentage or any other conventional or later-determined performance objective. In a step 515, an optimization target voltage is determined. For example, a particular IC design may have an optimization target voltage of 1.7V. However, all optimization target voltages are within the scope of the invention. In a step 520, a decision is made as to whether voltage scaling is needed. The performance objectives defined above may be such that additional voltage scaling (or AVS) circuitry may not be needed. If voltage scaling is not needed, a conventional IC design method may then be employed.

However, the flow diagram of FIG. 5 assumes that voltage scaling is needed. In a step 525, a decision is made as to whether the voltage scaling is to be static (non-AVS) or adaptive (AVS). The result of the decision of the step 525 determines the PVT corners and libraries that are to be used in generating a netlist. In a step 530, a functional IC design and a register transfer logic (RTL representation) representation of that IC design are generated. Those skilled in the pertinent art understand how to generate a functional IC design and an RTL representation based thereon.

In a step 535, the RTL representation is synthesized to yield a netlist using the optimization target voltage. The synthesis is performed with reference to a unitless performance/power quantifier, either in terms of units or unitless, as the metric by which optimization is judged. Those skilled in the pertinent art are familiar with the construction and content of libraries of IC devices in general and are aware that such libraries contain standard implementations, along with physical attributes, of devices that can be implemented in an IC. Some attributes are largely independent of fabrication process variation, including the numbers and locations of device terminals, the shape and size of the device footprint and the numbers and types of process steps that should be undertaken to fabricate the device and process-dependent attributes. Other attributes vary, such as the switching speed of the device (if it is a transistor), the drive voltage of the device, the current-handling capability of the device and the power consumption of the device. As described above, the process-dependent attributes of the library are determined with reference to PVT corners; the PVT corners of a library employed to design an IC that implements voltage scaling are different from those of a conventional library. In general, since voltage scaling renders conventional, more extreme, PVT corners irrelevant, design margins can be relaxed, and greater flexibility exists with respect to the selection of devices to be used in an IC.

During the synthesis of the RTL representation into the netlist, fundamental decisions may be made regarding the architecture of the IC, including its logic circuits. Those skilled in the pertinent art understand that logic circuits may be optimized in different ways. An IC or a functional block in an IC may need to perform a multiply function. However, that multiply function may be implemented with different multiplier architectures. Multipliers having wide datapaths (parallel units) may be faster but consume more power and area than multipliers having narrower datapaths (e.g., a single unit with intermediate result feedback). The RTL representation may be generated with reference to a library containing more than one architecture for various logic circuits, and choices among those architectures may be made based on the greater latitude afforded by static voltage scaling or AVS.

In a step 540, devices are placed, a clock tree is synthesized, and routing is determined according to the RTL representation and at the optimization target voltage. In a step 545, a timing signoff is performed at the optimization target voltage. Those skilled in the pertinent art understand how to perform timing signoff at a given drive voltage. In a step 550, the degree of optimization existing in the IC design is expressed in terms of a unitless performance/power quantifier. The unitless performance/power quantifier may have units or be unitless. The method ends in an end step 555.

FIGS. 6 and 7 together are a flow diagram of another embodiment of a method of designing an IC employing voltage scaling that uses a unitless performance/power quantifier as a metric to gauge the degree of optimization. The method begins in a start step 605. In a step 610, performance objectives are determined. As above, the performance objectives may be expressed in terms of a target data throughput, a target clock frequency, a target die size, a target overall power consumption, a target yield percentage or any other conventional or later-determined performance objective. In a step 615, an optimization target voltage is determined. For example, a particular IC design may have an optimization target voltage of 1.7V. However, all optimization target voltages are within the scope of the invention. In a step 620, a decision is made as to whether voltage scaling is needed. The performance objectives defined above may be such that additional voltage scaling (or AVS) circuitry may not be needed. If voltage scaling is not needed, a conventional IC design method may then be employed.

However, the flow diagram of FIG. 6 assumes that voltage scaling is needed. In a step 625, a decision is made as to whether the voltage scaling is to be static (non-AVS) or adaptive (AVS). The result of the decision of the step 630 determines the PVT corners and libraries that are to be used in generating a functional IC design and a corresponding RTL representation. In a step 630, a functional IC design and corresponding RTL representation are generated. In a step 635, a candidate netlist is generated from the RTL representation. In a step 640, critical paths in the candidate netlist are identified. In a step 645, the method continues at point A of FIG. 7.

In FIG. 7, the method continues in a step 705. In steps 710-725, the performance of critical paths is increased. In a step 710, the performance of a particular critical path is increased, perhaps by substituting a circuit in the critical path with one having a wider datapath or substituting one or more devices in the critical path with ones having faster switching speeds. In a more specific embodiment, the speed of each critical path is increased until the path is only barely critical. In a decisional step 715, it is determined whether timing can still be met in light of the resulting performance increase. If so, it is determined in a decisional step 720 whether the performance increase has resulted in an increase in the unitless performance/power quantifier. If so, the performance of another critical path is increased in the step 710, and so on for at least some of the critical paths in the IC design. If either timing cannot be met or the unitless performance/power quantifier has not increased, the changes resulting in the performance increase are ignored in a step 725.

In steps 730-745, the area of noncritical paths is decreased. In a step 730, the area of a particular critical path is decreased, perhaps by substituting a circuit in the critical path with one having a narrower datapath or substituting one or more devices in the critical path with ones having smaller footprints. In a decisional step 735, it is determined whether timing can still be met in light of the resulting area decrease. If so, it is determined in a decisional step 740 whether the area decrease has resulted in an increase in the unitless performance/power quantifier. If so, the area of another critical path is decreased in the step 730, and so on for at least some of the noncritical paths in the IC design. If either timing cannot be met or the unitless performance/power quantifier has not increased, the changes resulting from the area decrease are ignored in a step 745.

In steps 750-765, the power consumption of noncritical paths is decreased. In a step 750, the power consumption of a particular critical path is decreased, perhaps by substituting a circuit in the critical path with one having fewer devices or substituting one or more devices in the critical path with ones having lower leakage currents. In a decisional step 755, it is determined whether timing can still be met in light of the resulting decrease in power consumption. If so, it is determined in a decisional step 760 whether the decrease in power consumption has resulted in an increase in the unitless performance/power quantifier. If so, the power consumption of another critical path is decreased in the step 750, and so on for at least some of the noncritical paths in the IC design. If either timing cannot be met or the unitless performance/power quantifier has not increased, the changes resulting from the decrease in power consumption are ignored in a step 765. In a step 770, the method continues at point B of FIG. 6.

In a step 650, the method of FIG. 6 resumes. In a step 655, devices are placed, a clock tree is synthesized, and routing is determined according to the RTL representation and at the optimization target voltage. In a step 660, a timing signoff is performed at the optimization target voltage. In a step 665, the degree of optimization existing in the IC design is expressed in terms of its unitless performance/power quantifier. The unitless performance/power quantifier may have units or be unitless. The method ends in an end step 670.

FIG. 8 is a pair of graphs relating a unitless performance/power quantifier to drive voltage, which provides an the example comparing libraries using $\lambda_T$. The example of FIG. 8 is based on HSpice simulations of a 40/50 nm data-path ("d1w20" indicates an X1 drive strength devices driving a 20-micron wire PI model) using several channel-length variants. Table 2, below, gives relative threshold voltages (where "$HV_T$" indicates a relatively high threshold voltage, "$SV_T$" indicates a relatively low threshold voltage, and "$SV_T$" indicates a standard threshold voltage), channel lengths and track configurations for the various devices plotted in the graphs of FIG. 8.

TABLE 2

Devices Used in the Graphs of FIG. 8

| Device Name | Threshold Voltage | Channel (nm) | Track |
|---|---|---|---|
| hxd | $HV_T$ | 50 | 9 |
| hxp | $HV_T$ | 50 | 12 |
| lmd | $LV_T$ | 40 | 9 |
| lmp | $LV_T$ | 40 | 12 |
| lxd | $LV_T$ | 50 | 9 |
| lxp | $LV_T$ | 50 | 12 |
| smd | $SV_T$ | 40 | 9 |
| smp | $SV_T$ | 40 | 12 |
| sxd | $SV_T$ | 50 | 9 |
| sxp | $SV_T$ | 50 | 12 |

The relative plots for different channel length variants reflect their relative benefits. The upper graph of FIG. 8 shows the worst-case power at $V_{NOM}$. The lower graph shows the worst-case-power at $V_{MAX}$. $V_{AVS\_Power}$ is set at 7.5% below $V_{NOM}$.

It is important to note that the graphs of FIG. 8 do not reflect an RTL representation that has been synthesized to exploit the voltage change, but instead an HSpice circuit that has been simulated at different voltage levels. Thus, the denominator (power) in the PP$_I$ computations is constant. This is the reason the $\lambda_I$ curves are fairly linear, and why their slopes are constant between the two graphs with different values for $V_{AVS\_Power}$. Were placement and routing synthesized from an RTL representation, the values of PP$_I$ would increase more dramatically for each voltage step value, since the process of synthesis can realize a different circuit for the same RTL. Correspondingly, Power$_{Circuit,I}$(FF,V$_{DD}$=(V$_{AVS\_Power}$, T$_{Worst\_Power}$)) can change for each of these circuits.

Note that each of the graphs depicts the substantial increase in $\lambda_I$ available by using AVS. This demonstrates the increase in performance possible with AVS at the expense of little additional power. Conversely, optimization algorithms can trade this extra performance to reduce power and area.

FIG. 9 is a graph relating unitless performance/power quantifiers for candidate fabrication technologies, namely 65 nm and 40 nm technologies. The 40 nm technology is a better candidate for an AVS architecture and optimization based on the fact that the performance/power quantifier for the 40 nm technology is substantially superior to (higher than) that for the 65 nm technology. The performance/power quantifiers therefore allow impartial comparison across technologies, an important feature that can be used in technology, optimization and architectural decisions.

Those skilled in the art to which this application relates will appreciate that other and further additions, deletions, substitutions and modifications may be made to the described embodiments.

What is claimed is:

1. A method of designing an integrated circuit, comprising:
generating a functional design for said integrated circuit;
determining performance objectives for said integrated circuit;
determining an optimization target voltage for said integrated circuit;
determining whether said integrated circuit needs voltage scaling to achieve said performance objectives at said optimization target voltage and, if so, whether said integrated circuit is to employ static voltage scaling or adaptive voltage scaling;
using said optimization target voltage to synthesize a layout from said functional integrated circuit design that meets said performance objectives by employing a unitless performance/power quantifier as a metric to gauge a degree of optimization thereof, wherein said using is performed by a processor, wherein said using includes employing said optimization target voltage to synthesize a netlist from said functional integrated circuit design that meets said performance objectives; and
performing a timing signoff of said layout at said optimization target voltage.

2. The method as recited in claim 1 wherein said using comprises
generating a layout of said integrated circuit from said netlist.

3. The method as recited in claim 1 wherein said performance objectives include one selected from the group consisting of:
a target power consumption,
a target area, and
a target speed.

4. The method as recited in claim 1 wherein said using comprises:
synthesizing a clock tree for said integrated circuit; and
determining a routing at said optimization target voltage.

5. The method as recited in claim 1 wherein said determining whether said integrated circuit needs said voltage scaling is carried out with respect to more than one fabrication technology, said performance/power quantifier being normalized across said more than one fabrication technology.

6. The method as recited in claim 1 wherein said adaptive voltage scaling is capable of being carried out without software control.

7. The method as recited in claim 1 wherein said using comprises decreasing an area of a safe zone associated with said integrated circuit.

8. An integrated circuit designed by the method as recited in claim 1.

9. A method of designing an integrated circuit, comprising:
generating a functional design for said integrated circuit;
determining performance objectives for said integrated circuit, said performance objectives including one selected from the group consisting of:
a target power consumption,
a target area, and
a target speed;
determining an optimization target voltage for said integrated circuit;
determining whether said integrated circuit needs voltage scaling to achieve said performance objectives at said optimization target voltage and, if so, whether said integrated circuit is to employ static voltage scaling or adaptive voltage scaling;
using said optimization target voltage to synthesize a netlist from said functional integrated circuit design that meets said performance objectives by employing a unitless performance/power quantifier as a metric to gauge a degree of optimization thereof, wherein said using is performed by a processor;
synthesizing a clock tree for said integrated circuit;
determining a routing at said optimization target voltage;
generating a layout of said integrated circuit from said netlist; and
performing a timing signoff of said layout at said optimization target voltage.

10. The method as recited in claim 9 wherein said determining whether said integrated circuit needs said voltage scaling is carried out with respect to more than one fabrication technology, said performance/power quantifier being normalized across said more than one fabrication technology.

11. The method as recited in claim 9 wherein said adaptive voltage scaling is capable of being carried out without software control.

12. The method as recited in claim 9 wherein said using comprises decreasing an area of a safe zone associated with said integrated circuit.

13. An integrated circuit designed by the method as recited in claim 9.

14. A computer program product, comprising a non-transitory computer usable medium having a computer readable program code embodied therein, said computer readable program code adapted to be executed to implement a method of designing an integrated circuit, said method comprising: generating a functional design for said integrated circuit;
determining performance objectives for said integrated circuit;
determining an optimization target voltage for said integrated circuit;
determining whether said integrated circuit needs voltage scaling to achieve said performance objectives at said optimization target voltage and, if so, whether said integrated circuit is to employ static voltage scaling or adaptive voltage scaling;

using said optimization target voltage to synthesize a layout from said functional integrated circuit design that meets said performance objectives by employing a unitless performance/power quantifier as a metric to gauge a degree of optimization thereof, wherein said using includes employing said optimization target voltage to synthesize a netlist from said functional integrated circuit design that meets said performance objectives; and performing a timing signoff of said layout at said optimization target voltage.

15. A computer program product, comprising a non-transitory computer usable medium having a computer readable program code embodied therein, said computer readable program code adapted to be executed to implement a method of designing an integrated circuit, said method comprising: generating a functional design for said integrated circuit;

determining performance objectives for said integrated circuit, said performance objectives including one selected from the group consisting of:

a target power consumption, a target area, and a target speed;

determining an optimization target voltage for said integrated circuit;

determining whether said integrated circuit needs voltage scaling to achieve said performance objectives at said optimization target voltage and, if so, whether said integrated circuit is to employ static voltage scaling or adaptive voltage scaling;

using said optimization target voltage to synthesize a netlist from said functional integrated circuit design that meets said performance objectives by employing a unitless performance/power quantifier as a metric to gauge a degree of optimization thereof;

synthesizing a clock tree for said integrated circuit;

determining a routing at said optimization target voltage;

generating a layout of said integrated circuit from said netlist; and performing a timing signoff of said layout at said optimization target voltage.

* * * * *